United States Patent [19]

Hosking

[11] Patent Number: 4,686,608
[45] Date of Patent: Aug. 11, 1987

[54] ELECTRONIC EQUIPMENT RACK INTERCONNECTION SYSTEM

[75] Inventor: Michael B. Hosking, Poway, Calif.

[73] Assignee: General Dynamics, Electronics Division, San Diego, Calif.

[21] Appl. No.: 756,682

[22] Filed: Jul. 19, 1985

[51] Int. Cl.⁴ .............................................. H02B 1/10
[52] U.S. Cl. ................................... 361/428; 361/391; 361/415
[58] Field of Search ........ 339/17 LM, 17 M, 108 TP; 361/390–391, 413, 415, 428–429

[56] References Cited

U.S. PATENT DOCUMENTS

| | | | |
|---|---|---|---|
| 2,173,101 | 9/1939 | Fiedler | 361/338 |
| 3,129,044 | 4/1964 | Lyman, Jr. et al. | 339/18 |
| 3,430,182 | 2/1969 | Blanche | 339/17 |
| 3,710,199 | 1/1973 | Cignoni, Jr. | 361/391 |
| 3,941,445 | 3/1976 | Lacan | 339/64 |
| 4,027,935 | 6/1977 | Byrnes et al. | 339/48 |
| 4,062,617 | 12/1977 | Johnson | 339/75 M |
| 4,066,312 | 1/1978 | Faure | 339/48 |
| 4,179,724 | 12/1979 | Bonhomme | 361/391 |
| 4,180,846 | 12/1979 | Wilson et al. | 361/357 |
| 4,498,717 | 2/1985 | Reimer | 339/17 M |

FOREIGN PATENT DOCUMENTS 0933215 8/1963 United Kingdom ................ 361/391

OTHER PUBLICATIONS

Barkhuff, "Connector", IBM Technical Disclosure Bulletin, vol. 22, No. 1, 6/79, pp. 158–159.

Primary Examiner—A. D. Pellinen
Assistant Examiner—Gregory D. Thompson
Attorney, Agent, or Firm—Brown, Martin, Haller & Meador

[57] ABSTRACT

An interconnection system for an electronic equipment rack containing a plurality of electronic equipment units mounted in drawers or slides slidably mounted in spaced parallel relationship on the rack. The system includes a rigid backplane panel for mounting across one wall of the rack and a plurality of spaced parallel conductors extending across the panel in a direction transverse to the equipment units. A plurality of mating connector assemblies are provided for signal communication between the electronic equipment units and the backplane conductors, and are mounted to extend transversely to the backplane conductors in alignment with the equipment units. The mating connector assembly is connected to the aligned equipment unit and includes signal conditioning devices for predetermined conditioning of electrical signals in the system, and conductors for connecting the signal conditioning devices to preselected ones of the backplane conductors. The electronic equipment unit and mating connector assembly can be removed from the rack as a unit for replacement.

13 Claims, 9 Drawing Figures

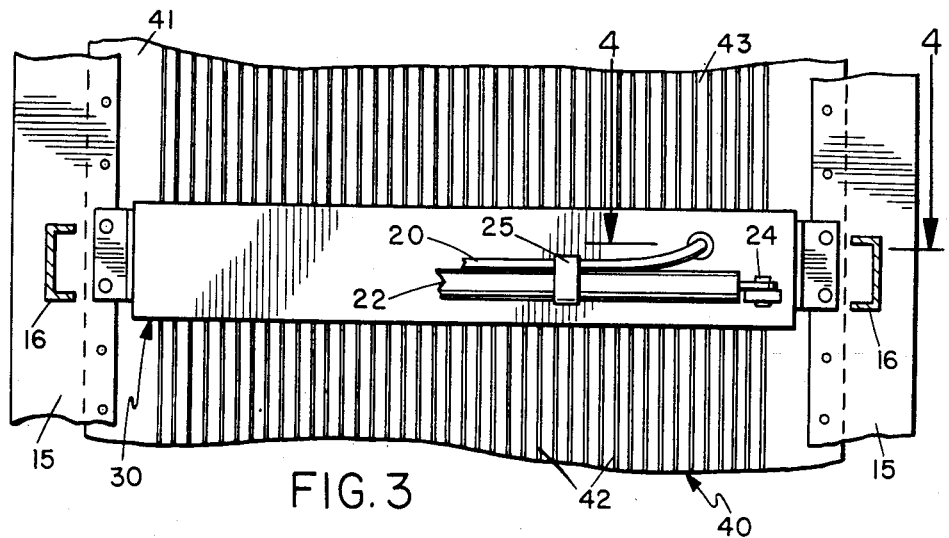
FIG. 3
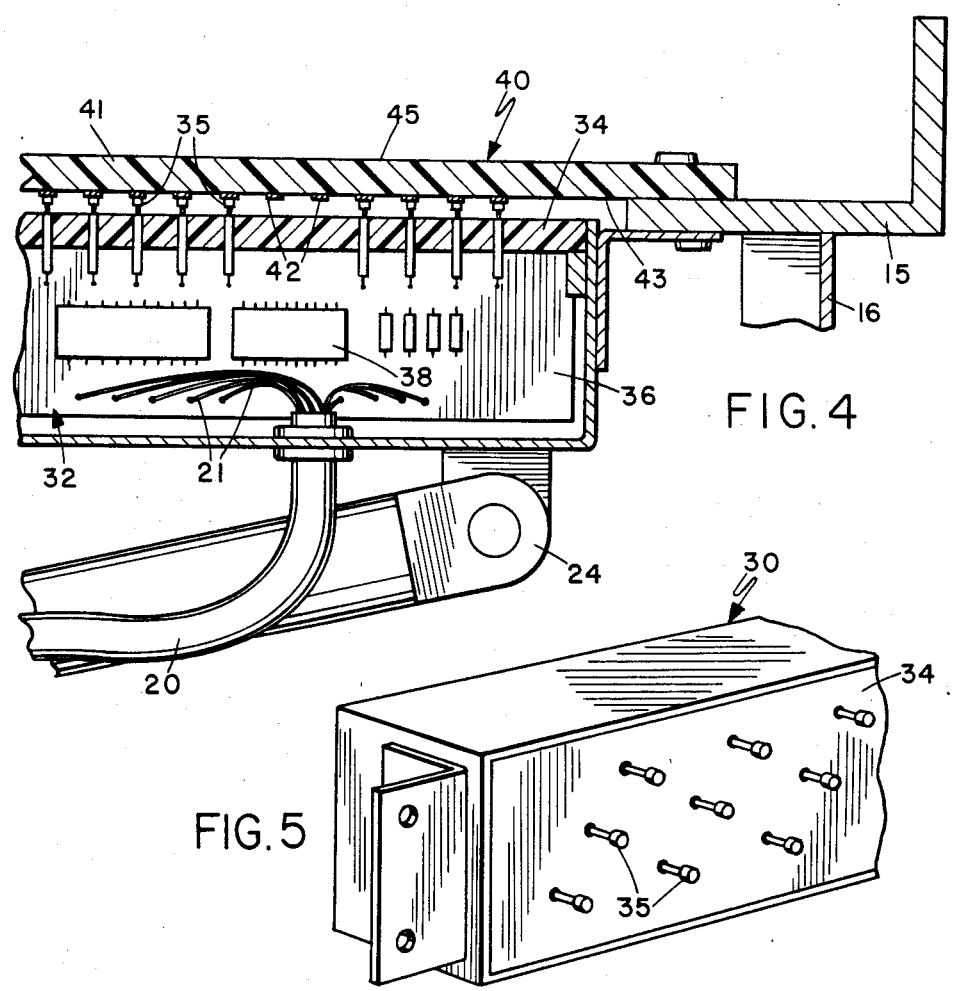
FIG. 4
FIG. 5

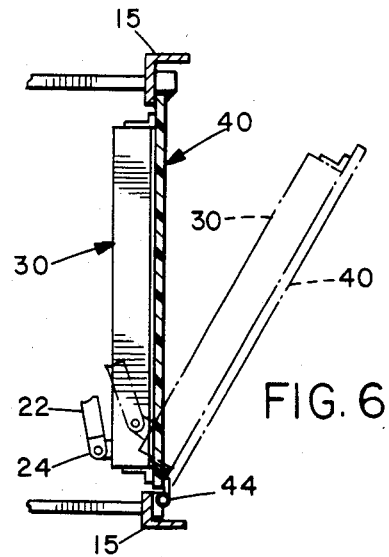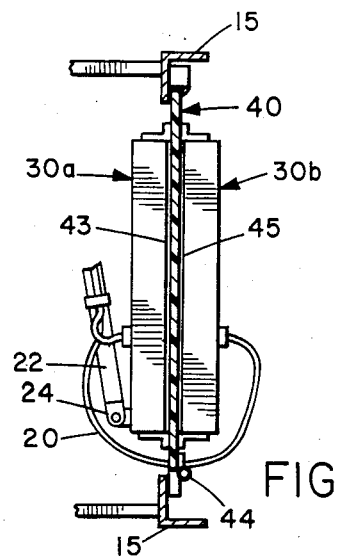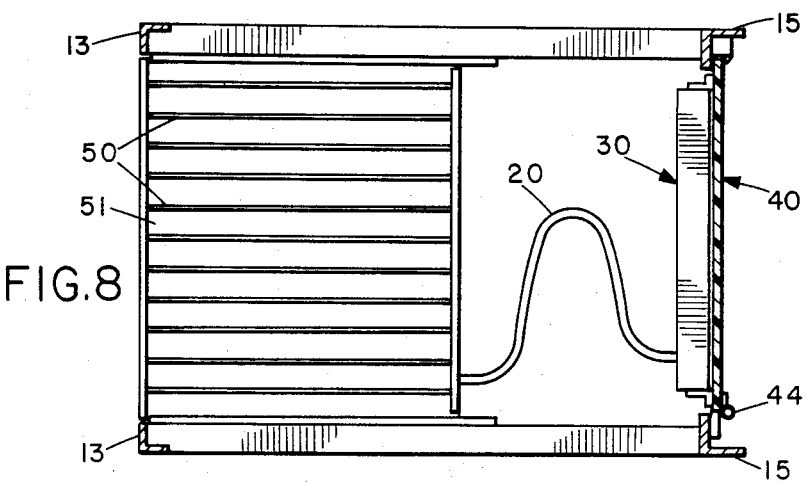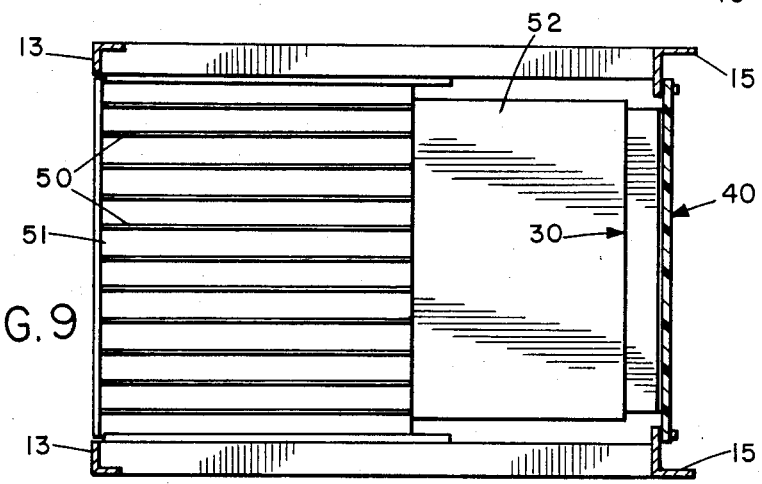

ELECTRONIC EQUIPMENT RACK INTERCONNECTION SYSTEM

BACKGROUND OF THE INVENTION

1. Field of the Invention

This invention relates in general to standardization of electronic device/rack assemblies and more particularly to the use of a wiring, signal conditioning, and standardized electrical backplane system.

2. Background of the Invention

There are many problems associated with the interfacing of various electronic devices, particularly with the need to frequently reconfigure automatic test equipment.

Automatic test equipment is configured to optimally test a specific suite of units under test. When this suite changes the test station has to be reconfigured to provide the new test capabilities. The changes that continue to occur in the suite of units to be tested, for example, as a result of improvements, demand a corresponding change in the test equipment. Another reason for reconfiguration is that after a passage of time an instrument used in the test station may become obsolete and will have to be replaced by a new instrument.

It is common in instrument construction to mount electronic equipment in drawers or slide units which slide into a suitable equipment rack in spaced parallel relationship. The so-called "drawers" may comprise modular instrument housings which slide into suitable slots in the rack, or supports for printed circuit boards or cards which plug into a card cage or rack. The electronic equipment in the rack must be suitably interconnected, and this can cause problems when changes must be made in an overall system mounted on the rack.

Different equipment manufacturers or distributors of electronic equipment often do not employ a consistent programming format and protocol. There is often little uniformity in the location and distribution of input/output signals of similar electronic equipment produced by different manufacturers. Even when identical programming formats and protocols are used, details of the implementation differ from manufacturer to manufacturer. Therefore, many electronic assemblies that have identical electrical characteristics are not interchangeable without some sort of programming or reconfiguration.

There are also often mechanical differences between electronic equipment supports or drawers designed to slide into an equipment rack. These differences also prevent easy interchangeability. The differences include rather simple items such as connector quantity, location, size and pin allocation. These seemingly trivial problems force conventional rack wiring to undergo extensive rework when a system has to be reconfigured. Expensive, complex, and time consuming reconstruction often beyond the capability of field personnel to implement, must be performed. This rack wiring has been a major impediment to all previous attempts to provide easy reconfigurability in all existing systems.

Therefore, it is desirable to have a rack wiring and signal conditioning system whereby the input/output signals to electronic devices performing a similar function are identical.

It is particularly desirable that one electronic device may be easily and quickly substituted for another electronic device.

It is further desirable that the system allow the electronic devices within a rack to easily interface with one another.

If is further desirable that such a system facilitate communication between racks.

It is also desirable that such a system not detract from the present advantages of rack systems, such as the ease of access to the electronic equipment.

SUMMARY OF THE INVENTION

This invention is a rack wiring and signal conditioning system for use in an electronic equipment rack having a frame and containing an electronic device. The system generally comprises a backplane for attachment across one wall of the rack having a series of spaced, parallel conductors extending across it in a direction transverse to the equipment units mounted on the rack, and a series of mating connectors for connecting respective ones of the equipment units to preselected ones of the backplane conductors, the mating connectors extending transverse to the backplane conductors in alignment with respective ones of the equipment units. Each mating connector includes signal conditioning devices electrically interposed in the signal communication path between the backplane and the respective equipment unit for suitable conditioning of the signals passing through them.

Signal conditioning includes performing the functions of switching, buffering, and making the signals compatible. The backplane is substantially a rigid support panel. In a preferred embodiment the isolated backplane conductors have a plated surface exposed as a contact surface. The isolated conductors are precisely located in a known and fixed position and selected ones of the conductors can be standardized as instrument busses, control busses, data busses, unit under test, stimulus busses, power busses, and other uses.

In a preferred embodiment, each connection is made between the mating connector and the backplane with springloaded connector pins which press against the exposed, isolated conductors on the backplane.

The rack interconnection system of the present invention allows the electronic equipment unit or drawer, cables, cable retractor, drawer connectors, and the mating connector to be treated as a functional entity resulting in only one connection between this functional entity and the backplane. The large, standardized, electrical backplane busses all voltages, signals, an controls to mating connectors which standardize the signals. This provides the capability of rapid reconfiguration of large automatic test equipment (ATE) systems and facilitates the substitution of alternate assemblies of electronic equipment.

Other features and many attendant advantages of the invention will become more apparent upon a reading of the following detailed description together with the drawings, wherein like reference numerals refer to like parts throughout.

BRIEF DESCRIPTION OF THE DRAWINGS

FIG. 3 is an enlarged sectional view taken on line 3—3 of FIG. 1.

FIG. 4 is a further enlarged sectional view taken on line 4—4 of FIG. 3.

FIG. 5 is a perspective view of a portion of the contact face of the connector.

FIG. 6 is a sectional view similar to a portion of FIG. 2, showing a hinged backplane and connector assembly.

FIG. 7 is a sectional view similar to FIG. 6, showing a double-faced backplane and connector assembly.

FIG. 8 is a sectional view similar to FIG. 6, showing an alternative card basket installation.

FIG. 9 is a sectional view similar to FIG. 8, but with the card basket coupled directly to the mating connector.

DETAILED DESCRIPTION OF THE INVENTION

Figure 1:
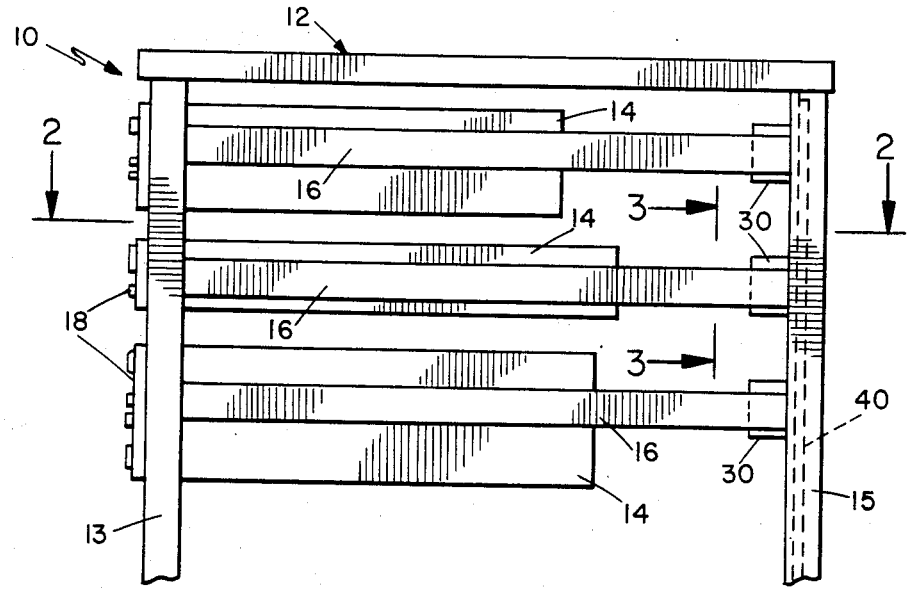
FIG. 1 is a side elevation view of a typical rack assembly with multiple instruments incorporating the rack wiring and signal conditioning system.

The drawings show some preferred embodiments of an interconnection system for equipment racks of the type commonly used in construction of electrical or electronic equipment systems. FIG. 1 of the drawings shows a typical equipment rack, shown generally as 10, for housing a plurality of electronic equipment units or 'drawers' 14. The units contain electrical or electronic components comprising the component parts of various types of electronic devices or instruments. In the embodiment shown in FIGS. 1 to 6 the electronic equipment units each comprise a housing containing electronic equipment and having a front panel 18 for monitoring and controlling the equipment. The rack comprises a suitable frame 12 having a front frame portion 13, a rear frame portion 15, and slides or rails 16 extending between the front and rear frame portions on opposite sides of the frame. The equipment units or drawers 14 are designed for sliding engagement on slides or rails 16 in a conventional manner as indicated in the drawings.

Although in FIGS. 1 to 6 the rack is of the type for mounting equipment units in the form of drawers for containing or supporting electronic instruments, it may alternatively be in the form of a card cage, as illustrated in the alternative embodiment shown in FIGS. 8 and 9, in which the equipment unit is designed for supporting equipment in the form of printed circuit boards or cards 50. In this case each equipment unit comprises a so called "card basket" which slides into suitable rails or slides on the frame and comprises a mother board 51 and circuit boards 50 which plug into the mother board 51. This embodiment is described in more detail below.

Thus the term "electronic equipment unit" refers to the drawer or support for slidable engagement in a rack or card cage as well as the electronic or electrical components contained in or supported by the drawer or other type of support.

Returning now to the first embodiment illustrated in FIGS. 1 to 6, FIG. 2 shows how, an electronic equipment drawer or unit 14 commonly may be slid forward on slide 16 from closed position 14a to an open position 14b for access to the electronic device within the drawer for service, replacement, and repair.

Figure 2:
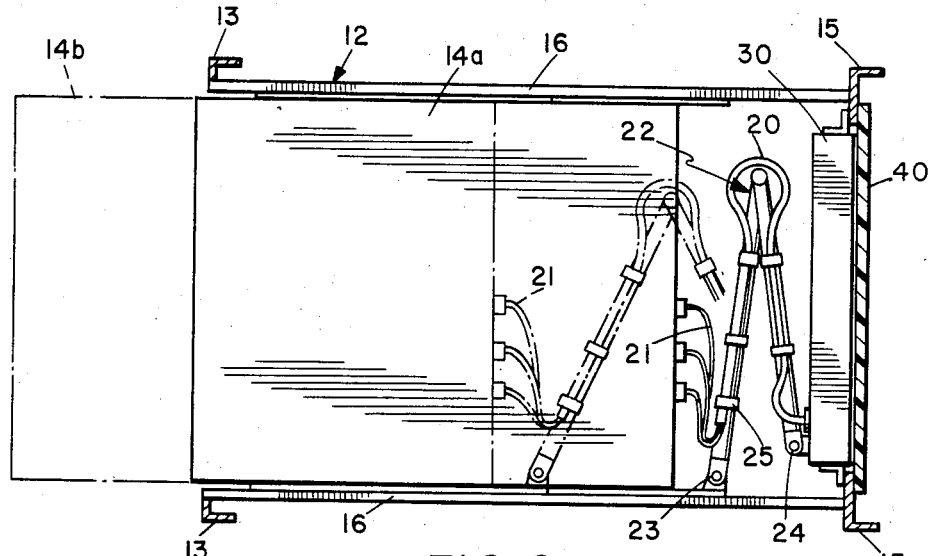
FIG. 2 is a sectional view taken on line 2—2 of FIG. 1.

FIGS. 1 to 6 of the drawings illustrate a first embodiment of an interconnection system for interconnecting various equipment units 14 slidably mounted on rack 10. The system basically comprises a backplane 40 mounted across a rear wall opening of the rack 10 and having a plurality of spaced parallel conductors 42 (see FIG. 3) extending across it in a direction transverse to the equipment units 14, and a plurality of mating connector devices 30 for connecting the respective equipment units to the backplane. A first set of pin connectors 35 (see FIG. 4) connect each connector device 30 to the backplane, as explained below, and a suitable second set of condutors such as cable 20, conveys electrical signals between the drawer 14 and mating connector 30. Cable 20 is typically composed of a plurality of individual conductors 21 which are enclosed in a suitable flexible tubular conduit and project out of the conduit at opposite ends for suitable connection to the rear end of the equipment unit 14 and to the mating connector 30, respectively, as shown in FIGS. 2 and 4. The cable 20 is supported between the equipment drawer and the mating connector 30 by a cable support/retractor mechanism 22 which is pivotally connected at its rear end 24 to the mating connector 30. The front end 23 of the mechanism 22 is pivotally connected to the rear end of unit 14. The front end may be secured at any convenient point to the unit 14, for example as shown in FIG. 2 where it is pivotally connected to the rear end of one of the side rails of unit 14 which engage in slides 16. The retractor mechanism 22 is pivotal about its mid point to allow the unit 14 to be extended and retracted as indicated in FIG. 1. Tie wraps 25 may be used to fasten the cable to the support/retractor mechanism 22. The cable support/retractor mechanism allows the drawer 14 or the mating connector 30 to be moved away from the other to some extent without unduly stressing the individual conductors 21, particularly at their point of attachment to equipment drawer 14 or mating connector 30.

The mating connectors 30 are mounted immediately adjacent the backplane, as shown in FIGS. 1 and 2. In the embodiment of FIG. 2, the connectors are mounted to extend across the rear rack portion 15, but they may alternatively be mounted directly on the backplane as explained in more detailed below.

FIG. 3 is an enlarged sectional view taken on line 3—3 of FIG. 1 and essentially shows the view looking rearward toward the backplane 40 from the equipment drawer 14. The backplane 40 generally comprises a large, substantially rigid, support panel 41.

The spaced conductors 42 extend in a direction transverse to the equipment units 14 so that they can act as common busses between the various devices. Thus, where the units 14 are vertically spaced one above the other in a generally horizontal orientation, the conductors 42 will extend in a vertical direction.

As shown in FIGS. 3 and 4, the isolated conductors 42 may be exposed, plated conductors mounted on an insulating block. The isolated conductors 42 have a plated surface exposed as a contact surface. The isolated conductors 42 are precisely located in a known and fixed position in the insulating block 41. The construction of the backplane is well known technology. Typical construction examples include the etched copper laminate construction, or an extruded semi-cured epoxy in which the conductors may be implated and sealed in a subsequent operation. Thus, the backplane forms a multi-conductor bus assembly parallel with its long axis, or axis transverse to the electronic equipment units 14 mounted on the rack to which the backplane is secured.

The backplane must provide the required electrical characteristics, including the needed shielding, conductor path characteristics, including controlled impedance, current carrying capacity, the required quantity and quality of paths for instrument busses, control busses, data busses, unit under test (UTT) stimulus busses, power busses, and also preferably additional isolated conductors 42 to prove for expansion capability.

The backplane can accommodate all intra-rack wiring. The inter-rack wiring is also extremely simplified and may be accomplished by a single cable harness that has a mating connector on each end. The mating connectors would not need any electronics or at most some simple switching, and would simply connect to the backplanes in each rack.

The matings connector 30 of FIG. 3 is disposed immediately adjacent to the backplane 40 so that it is in a position to make contact with the desired isolated conductors 42.

FIGS. 4 and 5 of the drawings show a preferred embodiment of the mating connector 30 of this invention in more detail. The connector 30 basically comprises suitable electronics 38 mounted within an outer housing. The electronics 38 is preferably mounted on printed circuit board 36, and comprises suitable signal conditioning devices for conditioning or standardizing the signals passing through the mating connector. Hard wired or selectable switching devices (not shown) may also be incorporated in the mating connector.

Projecting from one face of the connector housing are a plurality of contacts, which in the preferred embodiment illustrated comprise connector pins 35 which are arranged to make contact with selected ones of the backplane conductors 42 on the inside surface 43 of the backplane, as seen in FIG. 4. The pins 35 are suitably connected to appropriate points on the printed circuit board 36 for connection to the internal signal conditioning devices 38 in a manner which will be understood by those skilled in the field. The conductors 21 project through the housing wall for connection to the printed circuit board in a similar manner, as shown in FIG. 4. Thus the printed circuit board provides an interface between an electrical equipment unit and a backplane connector assembly on which suitable switching and conditioning circuitry can be provided. The connector pins 35 may be spring-loaded to press against exposed, isolated conductors in the backplane, or may be of the pin and socket type. The spring-loaded design offers several advantages such as lower fabrication cost and simplified alignment and mating of the mating connector to the backplane. The allocation of connector pins 35 in the mating connector 30 may be determined during assembly or may be controlled by switching located in the mating connector 30 itself. With this configuration, it can be seen that the mating connector 30 can be moved to any point along the long axis of the backplane. Thus, mating connectors can simultaneously mate with one backplane, and therefore can be used to interconnect various electronic assemblies and so form an operating system, without the need for any additional rack wiring.

The signal conditioning portion 32 of the mating connector 30 would commonly include a printed circuit board 36, conditioning electronics 38 and hard-wired or selectable switching (not shown).

The mating connector 30 provides the location to accommodate various signal conditioning functions including switching and buffering. Buffering is often required to reduce the loading on an electronic assembly or measurement signal caused by the external wiring. The buffering will also provide impedance matching, noise immunity, improved signal to noise ratio, and overall better system operation. The switching can also reduce the overall noise in the system by providing each assembly with the needed isolation. The signal conditioning 32 of the mating connector 30 is also used to overcome the programming format and protocol incapatibilities between various electronic devices as discussed in the background of the invention above, and provide the programming format, timing, and protocol changes. This is most readily accomplished by using a microprocessor, memory, and logic circuits.

It is preferable to standardize the backplane 40 by allocating specific isolated connectors 42 or connector groups to form a specific signal function such as power, control, data, instrument, or stimulus busses. In this configuration, the electronic equipment unit, cable 20 and mating connector 30 can be treated as a single entity because the circuitry in the mating connector will make similar electronic equipment units identical. These entities may then be connected to the standardized backplane at any point along it long axis. Isolated conductors 42 on the backplane 40 which have not been preselected to perform standardized functions may be allocated to perform special purpose functions for a specific hardware rack.

The configuration in the present invention avoids the previously discussed mechanical differences between electronic equipment units and allow hard rack systems to be reconfigured relatively simply. Considering the electronic equipment unit, the cables, the cable retractor, the drawer connectors, and the mating connector as a functional entity or unit, only one connection between this functional entity and the backplane is required. When an electronic equipment unit has to be exchanged with another during a reconfiguration operation, the complete functional entity can be exchanged rather quickly and easily. This is very important in the field or under actual use where the time factor is extremely important. Of course, as a maintenance consideration, any one of the constituent parts of this entity may be repaired or replaced as appropriate and as time allows. The technique of this invention also makes it easy to adapt the present system to electronic devices utilizing newer technology.

Thus, the configuration of the invention allows easy substitution of electronic devices, allows multiple electronic devices in an equipment rack to communicate with one another, and allows easy communication between equipment racks so configured. If every backplane is identical, and all backplanes in every rack are connected in parallel, any electronic instrument can go into any location in any rack. This feature is made practical as a result of the mating connector concept with the internal electronics providing switching, buffering, and identification as previously described. This interconnection method facilitates reconfiguration of large test systems on a rack basis, as racks can readily added or removed.

The inter-rack interconnection, using a simple mating connector and cable to link backplane to backplane, greatly aids the transportability of the system. This cabling implementation aids transportation, as a system can readily be separated into rack or bay assemblies by removing the mating connector.

FIG. 6 illustrates an alternate preferred embodiment of the invention wherein the mating connector 30 clamps directly to the backplane 40. In this construction, the backplane 40 may have a hinge member 44 located along one side of its long axis allowing the backplane 40 and the connected mating connector to swing outward to the rear. In some systems it may be necessary to remove a rear axis cover to accomplish this. With the backplane 40 swung open, the mating connectors and all the instruments in the systems still remain connected and the conductors on the backplane will still be active. In this opened position both sides of the backplane can be accessed to permit the probing of the backplane and the isolated conductors 42 thereon and so improve maintainability by obtaining easy access to the signals going to and from the instruments. Note that the rear end 24 of the cable support/retractor mechanism 22 should be attached to the mating connector 30 in this configuration, preferably on the hinge 44 side to prevent excess cable strain and movement.

FIG. 7 illustrates another preferred backplane construction. Illustrated in FIG. 7 is a double-faced backplane having active isolated conductors 42 on both the inside surface 43 and outside surface 45 of backplane 40 which still retains the internal shielding by the use of an multilayer construction. In this case, mating connectors, inside mating connector 30a and outside mating connector 30b, may be mounted on respective sides of the backplane 40. This construction increases the potential number of conductors available for system interconnections while still maintaining the desired electrical characteristics.

The typical drawer may also use a card basket form of construction as shown in FIG. 8. In this configuration circuit boards 50 plug into a common mother board 51. Cable 20, such as a flat ribbon cable, connects the mother board with the mating connector 30 on backplane 40. A flexible ribbon cable may not require a cable carrier/retractor mechanism for support. In this card basket configuration the backplane may swing about hinge 44.

FIG. 9 illustrates another form of the invention in conjunction with a plug-in card basket. In this configuration, the signals to and from circuit boards 50 are carried on an extended portion 52 of the plug-in basepanel to mating connector 30 for interface with the backplane 40. In this case, the mating connector will be integrated into the card basket, and the buffering and switching when required will be performed in the integrated mating connector. There is no need for cable or a cable retractor mechanism.

Although a particular embodiment of the invention has been illustrated and described, modifications and changes will become apparent to those skilled in the art, and it is intended to cover in the appended claims such modifications and changes as come within the true spirit and scope of the invention.

What I claim is:

1. An interconnection system for electrical interconnection of a plurality of electronic equipment units slideably mounted in spaced parallel relationship on an electronic equipment rack, the system comprising:
    a backplane for attachment to an electronic equipment rack frame, the frame comprising support means for releasably supporting a plurality of electronic equipment units in spaced parallel support planes, the backplane comprising a substantially rigid panel for mounting across one wall of the frame and a plurality of spaced conductors extending across the panel in a first direction transverse to said electronic equipment unit support planes for providing electrical signal paths between selected units; and
    a plurality of connector assemblies for providing signal communication between each electronic equipment unit and selected ones of the backplane conductors; each connector assembly comprising a mating connector device for mounting adjacent said backplane in alignment with a respective one of said electronic equipment units to extend transverse to said first direction across said backplane conductors, first connector means for electrically connecting said mating conductor device to preselected ones of said backplane conductors, and second connector means for electrically connecting said respective electronic equipment unit and said mating connector device;
    said mating connector device comprising selected interface circuitry for connection between said electronic equipment unit and selected backplane conductors.

2. The system as claimed in claim 1, wherein each of said mating connector devices is secured adjacent an inner face of said backplane, said backplane conductors comprise exposed conductor strips extending across said inner face, and said first connector means comprise contact means for connecting said connector device to preselected ones of said backplane conductors.

3. The system of claim 2, wherein said contact means comprise spring-loaded contact pins, each of said pins being positioned for contact with a preselected one of said backplane conductors.

4. The system of claim 1, wherein said mating connector devices are removably mounted on said backplane.

5. The system of claim 4, including means for pivotally securing said backplane to said frame along one of the edges of said backplane parallel to said backplane conductors.

6. The system of claim 1, wherein said second connector means for connecting each mating connector device to a respective electronic equipment unit comprises a flexible cable extending between each mating connector device and the associated equipment unit, and an expandable cable support and retractor mechanism for supporting said cable.

7. The system of claim 1, wherein said second connector means comprises a flexible flat ribbon-type cable for extending between each mating connector device and the associated equipment unit.

8. The system of claim 1, wherein said backplane conductors extend across opposite inner and outer faces of said backplane, and said mating connector assemblies include a first set of connector devices secured to the inner face of said backplane, a second set of connector devices secured to the outer face of said backplane, and connector means for connecting said first set of connector devices to said second set of connector devices.

9. The system of claim 1, wherein each mating connector device comprises a housing unit containing selected electronic interfacing devices for connection between an electronic equipment unit and selected backplane conductors.

10. An equipment rack interconnection system for connecting a plurality of electronic equipment units in spaced parallel relationship on a support rack, the system comprising:
    a rack having a front and rear face and spaced side faces, and a plurality of spaced slides extending across said side faces;
    a plurality of electronic equipment units for sliding engagement with selected slides of said rack in spaced parallel support planes;

a backplane for attachment to the rear face of said rack, the backplane having a plurality of spaced conductors extending across it in a first direction transverse to said electronic equipment unit support planes for providing a signal path between said units;

a plurality of connector assemblies for connecting said electronic equipment units to preselected ones of said backplane conductors, each connector assembly comprising a mating connector device for extending transverse to said first direction across said backplane conductors, first connector means for connecting said mating connector device to preselected ones of said backplane conductors, and second connector means for connecting said mating connector device to a respective one of said electronic equipment units;

said mating connector device comprising selected interface circuitry for connection between said electronic equipment unit and selected backplane conductors.

11. The system of claim 10, wherein said frame is an equipment card cage and said electronic equipment units comprise plug-in card baskets carrying a plurality of printed circuit boards.

12. The system of claim 11, wherein each mating connector device is connected to respective one of said plug-in card baskets.

13. The system of claim 12, wherein said card baskets have base panels with extended portions projecting to the rear of said card baskets for carrying signals to and from said card baskets, and said mating connector devices are connected to said extended portions of said card basket base panels.

* * * * *